(12) United States Patent
Clemons et al.

(10) Patent No.: US 10,566,188 B2
(45) Date of Patent: Feb. 18, 2020

(54) METHOD TO IMPROVE FILM STABILITY

(71) Applicant: Applied Materials, Inc., Santa Clara, CA (US)

(72) Inventors: Maximillian Clemons, Sunnyvale, CA (US); Michel Ranjit Frei, Palo Alto, CA (US); Mahendra Pakala, Fremont, CA (US); Mehul B. Naik, San Jose, CA (US); Srinivas D. Nemani, Sunnyvale, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/035,983

(22) Filed: Jul. 16, 2018

(65) Prior Publication Data

US 2019/0355579 A1 Nov. 21, 2019

Related U.S. Application Data

(60) Provisional application No. 62/672,887, filed on May 17, 2018.

(51) Int. Cl.
*H01L 21/00* (2006.01)
*H01L 21/02* (2006.01)

(52) U.S. Cl.
CPC .. *H01L 21/02337* (2013.01); *H01L 21/02123* (2013.01); *H01L 21/02271* (2013.01); *H01L 21/02304* (2013.01)

(58) Field of Classification Search
CPC ......... H01L 21/02359; H01L 21/02172; H01L 21/02175; H01L 21/02337; H01L 21/02304; H01L 21/02123; H01L 21/02271; C23C 14/087; C23C 16/048
See application file for complete search history.

(56) References Cited

U.S. PATENT DOCUMENTS

| 4,524,587 A | 6/1985 | Kantor |
| 5,050,540 A | 9/1991 | Lindberg |
| 5,114,513 A | 5/1992 | Hosokawa et al. |

(Continued)

FOREIGN PATENT DOCUMENTS

| CN | 101871043 A | 10/2010 |
| CN | 104047676 A | 9/2014 |

(Continued)

OTHER PUBLICATIONS

International Search Report and Written Opinion for PCT/US2018/043160 dated Jan. 31, 2019.

(Continued)

*Primary Examiner* — Richard A Booth
(74) *Attorney, Agent, or Firm* — Patterson + Sheridan, LLP

(57) ABSTRACT

Embodiments of the present disclosure generally relate to a film treatment process. In one embodiment, a transition metal oxide layer including a dopant is deposited on a substrate. After the doped transition metal oxide layer is deposited, a high pressure annealing process is performed on the doped transition metal oxide layer to densify the doped transition metal oxide without outgassing of the dopant. The high pressure annealing process is performed in an ambient environment including the dopant and at a pressure greater than 1 bar.

20 Claims, 2 Drawing Sheets

(56) References Cited

U.S. PATENT DOCUMENTS

| | | |
|---|---|---|
| 5,149,378 A | 9/1992 | Ohmi et al. |
| 5,319,212 A | 6/1994 | Tokoro |
| 5,590,695 A | 1/1997 | Siegele et al. |
| 5,620,524 A | 4/1997 | Fan et al. |
| 5,858,051 A | 1/1999 | Komiyama et al. |
| 5,879,756 A | 3/1999 | Fathi et al. |
| 5,880,041 A | 3/1999 | Ong |
| 5,940,985 A | 8/1999 | Kamikawa et al. |
| 6,082,950 A | 7/2000 | Altwood et al. |
| 6,150,286 A | 11/2000 | Sun et al. |
| 6,242,368 B1 | 6/2001 | Holmer et al. |
| 6,251,751 B1 | 6/2001 | Chu et al. |
| 6,297,539 B1 * | 10/2001 | Ma .................. C23C 14/083 257/410 |
| 6,299,753 B1 | 10/2001 | Chao et al. |
| 6,319,766 B1 | 11/2001 | Bakli et al. |
| 6,334,266 B1 | 1/2002 | Moritz et al. |
| 6,368,412 B1 | 4/2002 | Gomi |
| 6,442,980 B2 | 9/2002 | Preston et al. |
| 6,500,603 B1 | 12/2002 | Shioda |
| 6,583,497 B2 | 6/2003 | Xia et al. |
| 6,619,304 B2 | 9/2003 | Worm |
| 6,797,336 B2 | 9/2004 | Garvey et al. |
| 7,055,333 B2 | 6/2006 | Leitch et al. |
| 7,111,630 B2 | 9/2006 | Mizobata et al. |
| 7,114,517 B2 | 10/2006 | Sund et al. |
| 7,282,458 B2 | 10/2007 | Gates et al. |
| 7,460,760 B2 | 12/2008 | Cho et al. |
| 7,491,658 B2 | 2/2009 | Nguyen et al. |
| 7,503,334 B1 | 3/2009 | Shrinivasan et al. |
| 7,521,089 B2 | 4/2009 | Hillman et al. |
| 7,521,378 B2 | 4/2009 | Fucsko et al. |
| 7,576,441 B2 | 8/2009 | Yin et al. |
| 7,651,959 B2 | 1/2010 | Fukazawa et al. |
| 7,655,532 B1 | 2/2010 | Chen et al. |
| 7,825,042 B2 | 11/2010 | Mandal |
| 7,867,923 B2 | 1/2011 | Mallick et al. |
| 7,891,228 B2 | 2/2011 | Ding et al. |
| 8,027,089 B2 | 9/2011 | Hayashi |
| 8,318,584 B2 | 11/2012 | Li et al. |
| 8,349,085 B2 | 1/2013 | Tahara et al. |
| 8,449,942 B2 | 5/2013 | Liang et al. |
| 8,466,073 B2 | 6/2013 | Wang et al. |
| 8,481,123 B2 | 7/2013 | Kim et al. |
| 8,536,065 B2 | 9/2013 | Seamons et al. |
| 8,557,712 B1 | 10/2013 | Antonelli et al. |
| 8,563,445 B2 | 10/2013 | Liang et al. |
| 8,741,788 B2 | 6/2014 | Liang et al. |
| 8,906,761 B2 | 12/2014 | Kim et al. |
| 8,936,834 B2 | 1/2015 | Kim et al. |
| 9,121,515 B2 | 9/2015 | Yamamoto et al. |
| 9,153,442 B2 | 10/2015 | Wang et al. |
| 9,157,730 B2 | 10/2015 | Rajagopalan et al. |
| 9,257,314 B1 | 2/2016 | Rivera et al. |
| 9,306,026 B2 | 4/2016 | Toriumi et al. |
| 9,362,107 B2 | 6/2016 | Thadani et al. |
| 9,484,406 B1 | 11/2016 | Sun et al. |
| 9,570,551 B1 | 2/2017 | Balakrishnan et al. |
| 10,083,834 B2 | 9/2018 | Thompson et al. |
| 2001/0029108 A1 | 10/2001 | Tometsuka |
| 2001/0041122 A1 | 11/2001 | Kroeker |
| 2001/0050096 A1 | 12/2001 | Costantini et al. |
| 2002/0073922 A1 | 6/2002 | Frankel et al. |
| 2002/0122885 A1 | 9/2002 | Ahn |
| 2002/0148492 A1 | 10/2002 | Yamagata et al. |
| 2002/0151128 A1 | 10/2002 | Lane et al. |
| 2003/0030945 A1 | 2/2003 | Heinonen et al. |
| 2003/0101938 A1 | 6/2003 | Ronsse et al. |
| 2003/0148035 A1 | 8/2003 | Lingampalli |
| 2003/0207593 A1 | 11/2003 | Derderian et al. |
| 2004/0025908 A1 | 2/2004 | Douglas et al. |
| 2004/0060519 A1 | 4/2004 | Beauchaine et al. |
| 2004/0112409 A1 | 6/2004 | Schilling |
| 2004/0219800 A1 | 11/2004 | Tognetti |
| 2004/0248392 A1 | 12/2004 | Narwankar et al. |
| 2005/0003655 A1 | 1/2005 | Cathey et al. |
| 2005/0051194 A1 | 3/2005 | Sakashita et al. |
| 2005/0136684 A1 | 6/2005 | Mukai et al. |
| 2005/0191828 A1 | 9/2005 | Al-Bayati et al. |
| 2005/0198971 A1 | 9/2005 | Leitch et al. |
| 2005/0250347 A1 | 11/2005 | Bailey et al. |
| 2005/0269291 A1 | 12/2005 | Kent |
| 2006/0124613 A1 | 6/2006 | Kumar et al. |
| 2006/0207633 A1 | 9/2006 | Kim et al. |
| 2006/0226117 A1 | 10/2006 | Bertram et al. |
| 2006/0279025 A1 | 12/2006 | Heidari et al. |
| 2006/0290017 A1 | 12/2006 | Yanagisawa |
| 2007/0012402 A1 | 1/2007 | Sneh |
| 2007/0187386 A1 | 8/2007 | Kim et al. |
| 2007/0204797 A1 | 9/2007 | Fischer |
| 2007/0212850 A1 | 9/2007 | Ingle et al. |
| 2007/0243317 A1 | 10/2007 | Du Bois et al. |
| 2007/0256559 A1 | 11/2007 | Chen et al. |
| 2008/0074658 A1 | 3/2008 | Davis et al. |
| 2008/0115726 A1 | 5/2008 | Ingle et al. |
| 2008/0210273 A1 | 9/2008 | Joe |
| 2009/0081884 A1 | 3/2009 | Yokota et al. |
| 2009/0148965 A1 | 6/2009 | Kim et al. |
| 2009/0180847 A1 | 7/2009 | Guo et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2010/0006211 A1 | 1/2010 | Wolk et al. |
| 2010/0012292 A1 | 1/2010 | Yamazaki |
| 2010/0173495 A1 | 7/2010 | Thakur et al. |
| 2010/0304027 A1 | 12/2010 | Lee et al. |
| 2010/0320459 A1 | 12/2010 | Umeda et al. |
| 2010/0327422 A1 | 12/2010 | Lee et al. |
| 2011/0151677 A1 | 6/2011 | Wang et al. |
| 2011/0165781 A1 | 7/2011 | Liang et al. |
| 2011/0198736 A1 | 8/2011 | Shero et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0142192 A1 | 6/2012 | Li et al. |
| 2012/0171839 A1 * | 7/2012 | Chen .................. C23C 16/0272 438/396 |
| 2012/0175822 A1 | 7/2012 | Inamiya et al. |
| 2012/0252210 A1 | 10/2012 | Tohnoe |
| 2012/0285492 A1 | 11/2012 | Lee et al. |
| 2013/0194350 A1 | 8/2013 | Watanabe et al. |
| 2013/0233170 A1 | 9/2013 | Spiegelman et al. |
| 2013/0330042 A1 | 12/2013 | Nara et al. |
| 2013/0337171 A1 | 12/2013 | Sasagawa |
| 2014/0023320 A1 | 1/2014 | Lee et al. |
| 2014/0045300 A1 | 2/2014 | Chen et al. |
| 2014/0076494 A1 | 3/2014 | Miyashita et al. |
| 2014/0134827 A1 | 5/2014 | Swaminathan et al. |
| 2014/0138802 A1 | 5/2014 | Starostine et al. |
| 2014/0183743 A1 | 7/2014 | Matsumoto et al. |
| 2014/0231384 A1 | 8/2014 | Underwood et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0284821 A1 | 9/2014 | Hubbard |
| 2014/0322921 A1 | 10/2014 | Ahmad et al. |
| 2015/0000870 A1 | 1/2015 | Hosotani et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0159272 A1 | 6/2015 | Yoon et al. |
| 2015/0179501 A1 | 6/2015 | Jhaveri et al. |
| 2015/0255581 A1 | 9/2015 | Lin et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0111272 A1 | 4/2016 | Girard et al. |
| 2016/0118391 A1 | 4/2016 | Zhao et al. |

(56) References Cited

U.S. PATENT DOCUMENTS

| | | |
|---|---|---|
| 2016/0163540 A1 | 6/2016 | Liao et al. |
| 2016/0208414 A1 | 7/2016 | Odawara et al. |
| 2016/0260526 A1 | 9/2016 | Otto |
| 2016/0273758 A1 | 9/2016 | Fujimura |
| 2016/0274454 A1 | 9/2016 | Beasley et al. |
| 2016/0334162 A1 | 11/2016 | Kim et al. |
| 2016/0353522 A1 | 12/2016 | Rathi et al. |
| 2017/0005204 A1 | 1/2017 | Hosoba et al. |
| 2017/0011932 A1 | 1/2017 | Pethe et al. |
| 2017/0104062 A1 | 4/2017 | Bi et al. |
| 2017/0140996 A1 | 5/2017 | Lin et al. |
| 2017/0160012 A1 | 6/2017 | Kobayashi et al. |
| 2017/0194430 A1 | 7/2017 | Wood et al. |
| 2017/0253968 A1 | 9/2017 | Yahata |
| 2017/0263702 A1 | 9/2017 | Chan et al. |
| 2017/0314125 A1 | 11/2017 | Fenwick et al. |
| 2017/0358483 A1 | 12/2017 | Roy et al. |
| 2018/0019249 A1 | 1/2018 | Zhang et al. |
| 2018/0261480 A1 | 9/2018 | Liang et al. |

FOREIGN PATENT DOCUMENTS

| | | | |
|---|---|---|---|
| CN | 104089491 | A | 10/2014 |
| JP | H07048489 | B2 | 5/1995 |
| JP | 2004127958 | A | 4/2004 |
| JP | 2005064269 | A | 3/2005 |
| JP | 2005-333015 | A | 12/2005 |
| JP | 2007242791 | A | 9/2007 |
| JP | 2010-205854 | A | 9/2010 |
| JP | 2012-503883 | A | 2/2012 |
| JP | 2012-204656 | A | 10/2012 |
| JP | 2013516788 | A | 5/2013 |
| JP | 2014019912 | A | 2/2014 |
| KR | 20070075383 | A | 7/2007 |
| KR | 20090011463 | A | 2/2009 |
| KR | 1020090040867 | A | 4/2009 |
| KR | 20140003776 | A | 1/2014 |
| KR | 20140135744 | A | 11/2014 |
| KR | 20150006587 | A | 1/2015 |
| KR | 20150122432 | A | 11/2015 |
| TW | 200529284 | A | 9/2005 |
| TW | 200721316 | A | 6/2007 |
| TW | 201507174 | A | 2/2015 |
| WO | 2008/089178 | A2 | 7/2008 |
| WO | 2011/103062 | A2 | 8/2011 |
| WO | 2012/133583 | A1 | 10/2012 |
| WO | 2016065219 | A1 | 4/2016 |

OTHER PUBLICATIONS

International Search Report and Written Opinion for PCT/US2018/059643 dated Feb. 26, 2019.
Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.
Shimoyama, Takehiro et al., "Porous Aluminum for Heat Exchanger", Hitachi Chemical, pp. 19-20.
Kato, T. et al., "Heat Transfer Characteristics of a Plate-Fin Type Supercritical/Liquid Helium Heat Exchanger", ICEC 14 Proceedings Supplement, 1992, pp. 260-263.
Lee, Ho-Saeng et al., "The cooling heat transfer characteristics of the supercritical CO2 in mico-fin tube", Springer, Oct. 2, 2012, pp. 173-184.
International Search Report and Written Opinion dated Nov. 30, 2018 for Application No. PCT/US2018/041688.
International Search Report and Written Opinion for PCT/US2018/037539 dated Oct. 5, 2018.
International Search Report and Written Opinion for PCT/US2018/038822 dated Oct. 26, 2018.
International Search Report and Written Opinion for PCT/US2018/021715 dated Jun. 22, 2018.
International Search Report and Written Opinion from PCT/US2018/034036 dated Aug. 24, 2018.
International Search Report and Written Opinion dated Aug. 24, 2018 for Application No. PCT/US2018/034284.
International Search Report, Application No. PCT/US2018/028258 dated Aug. 9, 2018.
International Search Report and Written Opinion for PCT/US2018/035210 dated Aug. 24, 2018.
International Search Report and Written Opinion from PCT/US2019/012161 dated Apr. 30, 2019.
International Search Report and Written Opinion for PCT/US2019/014759 dated May 14, 2019.
International Search Report and Written Opinion for PCT/US2019/015332 dated May 15, 2019.
International Search Report and Written Opinion for PCT/US2018/059676 dated May 23, 2019.
International Search Report and Written Opinion for PCT/US2019/023431 dated Jul. 5, 2019.
Haskel Pressure on Demand, Pneumatic and Hydraulic Driven Gas Boosters, Apr. 30, 2016, 36 pp.
Taiwan Office Action dated Jul. 3, 2019 for Application No. 107136181.
International Search Report and Written Opinion for International Application No. PCT/US2019/029602 dated Aug. 14, 2019.
Taiwan Office Action dated Jun. 11, 2019 for Application No. 107138905.
Office Action for Japanese Application No. 2018-546484 dated Oct. 8, 2019.
International Search Report and Written Opinion for International Application No. PCT/US2019/040195 dated Oct. 25, 2019.

* cited by examiner

METHOD TO IMPROVE FILM STABILITY

CROSS-REFERENCE TO RELATED APPLICATIONS

This application claims priority to U.S. Provisional Patent Application Ser. No. 62/672,887, filed on May 17, 2018, which herein is incorporated by reference.

BACKGROUND

Field

Embodiments of the present disclosure generally relate to a film treatment process.

Description of the Related Art

Transition metal oxides, such as copper (II) oxide (CuO) or nickel (II) oxide (NiO), are used in random access memory (RAM), such as resistance RAM (ReRAM) or correlated electron RAM (CeRAM), due to the resistive switching phenomenon of the transition metal oxides. A CeRAM device typically includes a transition metal oxide layer disposed between two metal electrodes. The electrical resistivity of the transition metal oxide layer can switch between insulator phase and conductor phase when different voltages are applied to the transition metal oxide layer. The transition metal oxide layer may be doped with a dopant to improve electrical properties. An example of the dopant is carbon.

Conventionally, a transition metal oxide layer, such as a carbon-doped NiO layer, is deposited by chemical vapor deposition (CVD) at a temperature of about 350 degrees Celsius. However, carbon-doped NiO layer is thermodynamically unstable above the deposition temperature of about 350 degrees Celsius. Downstream processing steps for device fabrication can be at temperatures up to 400 degrees Celsius, resulting in outgassing of carbon dopant that drives an autocatalytic reduction of NiO. Autocatalytic reduction of NiO can lead to outgassing of almost all carbon dopant. Without the dopant, the transition metal oxide layer has poor electrical properties.

Therefore, an improved process is needed for forming a thermodynamically stable transition metal oxide layer.

SUMMARY

Embodiments of the present disclosure generally relate to a film treatment process. In one embodiment, a method includes depositing a doped transition metal oxide layer on a substrate at a first temperature, the doped transition metal oxide layer comprising a dopant, and annealing the doped transition metal oxide layer in a processing chamber at a chamber pressure greater than about 1 bar and in an ambient environment comprising the dopant.

In another embodiment, a method includes depositing a doped transition metal oxide layer on a first electrode, the doped transition metal oxide layer comprising a dopant, annealing the doped transition metal oxide layer in a processing chamber at a chamber pressure greater than about 1 bar and in an ambient environment comprising the dopant, and depositing a metal layer over the doped transition metal oxide layer.

In another embodiment, a method includes depositing a carbon-doped nickel (II) oxide layer on a substrate at a first temperature, annealing the carbon-doped nickel (II) oxide layer in a processing chamber at a chamber pressure greater than about 1 bar in a carbon-containing ambient environment, and depositing a metal layer over the carbon-doped nickel (II) oxide layer at a second temperature greater than the first temperature.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a film treatment process. In one embodiment, a doped transition metal oxide layer is deposited on a substrate. After the doped transition metal oxide layer is deposited, a high pressure annealing process is performed on the doped transition metal oxide layer to densify the doped transition metal oxide without outgassing of the dopant. The high pressure annealing process is performed in an ambient environment including the dopant and at a pressure greater than 1 bar.

The terms "over," "under," "between," and "on" as used herein refer to a relative position of one layer with respect to other layers. As such, for example, one layer disposed over or under another layer may be directly in contact with the other layer or may have one or more intervening layers. Moreover, one layer disposed between layers may be directly in contact with the two layers or may have one or more intervening layers. In contrast, a first layer "on" a second layer is in contact with the second layer. Additionally, the relative position of one layer with respect to other layers is provided assuming operations are performed relative to a substrate without consideration of the absolute orientation of the substrate.

Figure 1:
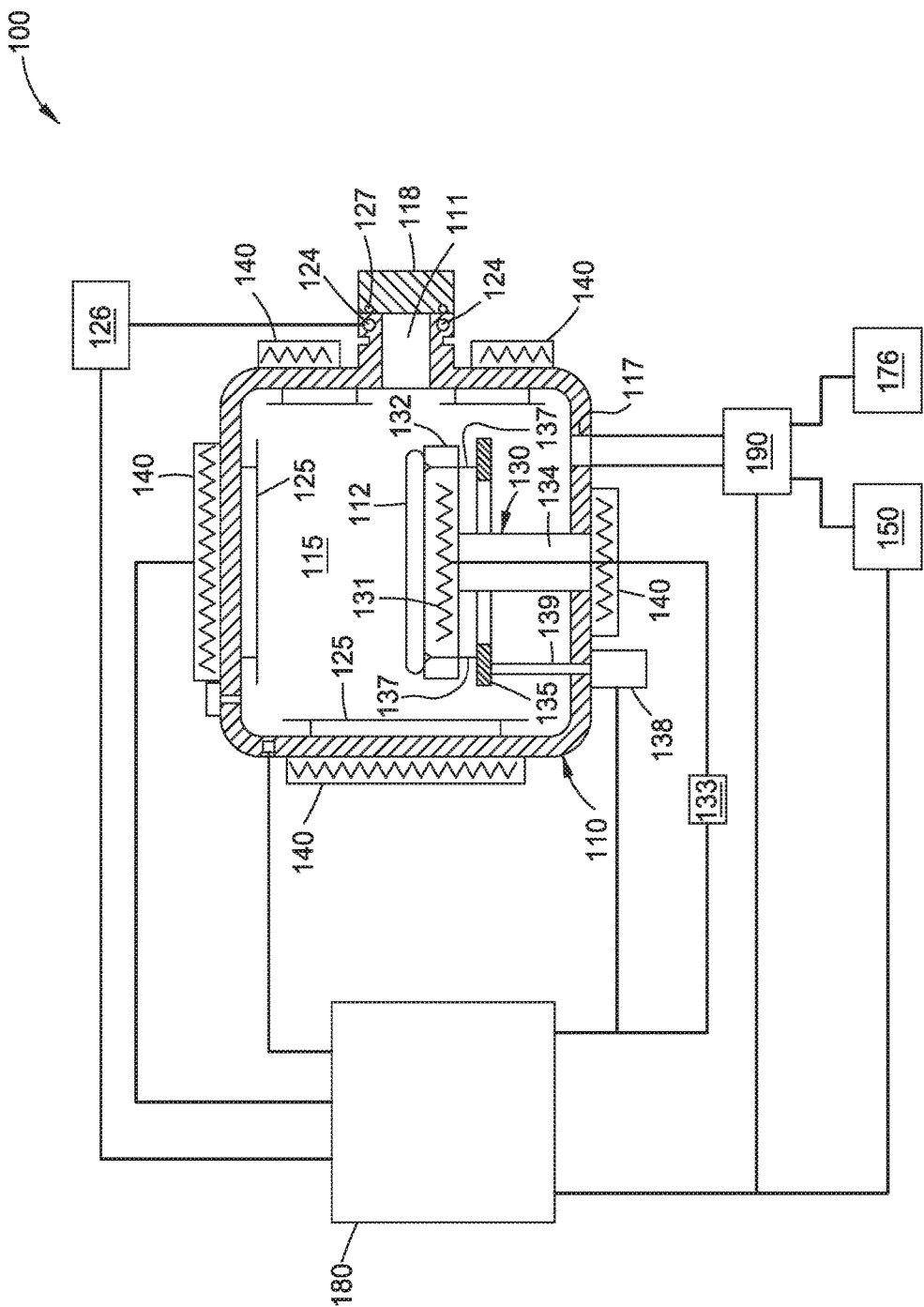
FIG. 1 is a schematic cross-sectional view of a processing chamber according to one embodiment described herein.

FIG. 1 is a schematic cross-sectional view of a processing chamber 100 according to one embodiment described herein. The processing chamber 100 has a body 110 that encloses an internal volume 115. The body 110 may be made from a corrosion resistant steel (CRS), such as but not limited to stainless steel. One or more heaters 140 are disposed on the body 110 and configured to heat the internal volume 115. One or more heat shields 125 are disposed on the body 110 that prevents heat loss from the processing chamber 100 into the outside environment. The heat shields 125 may be made from nickel-based steel alloys that exhibit high resistance to corrosion, such as but not limited to HASTELLOY®, ICONEL®, and MONEL®.

A substrate support 130 is disposed within the internal volume 115. The substrate support 130 has a supporting member 132 supported by a stem 134. Lift pins 137 extend through the supporting member 132 to lift or lower a substrate 112 disposed on the supporting member 132. The lift pins 137 are lifted or lowered by an annular member 135 connected to an actuator 138 via a rod 139. The supporting member 132 has a resistive heating element 131 embedded therein. A power source 133 is configured to electrically power the resistive heating element 131. The operation of the power source 133 as well as the actuator 138 is controlled by a controller 180.

The processing chamber 100 has an opening 111 formed in the body 110 through which the substrate 112 can be loaded and unloaded to and from the substrate support 130 disposed in the internal volume 115. A slit valve 118 having a high-pressure seal 127 is configured to seal the opening 111. The high-pressure seal 127 may be made from a polymer, for example a fluoropolymer, such as but not limited to a perfluoroelastomer or polytetrafluoroethylene (PTFE). A cooling channel 124 is located adjacent to the high-pressure seal 127 in order to maintain the high-pressure seals 127 below the maximum safe-operating temperature of the high-pressure seals 127 during processing. A cooling agent from a cooling fluid source 126, such as but not limited to an inert, dielectric, and high-performance heat transfer fluid, may be circulated within the cooling channel 124. The flow of the cooling agent from the cooling fluid source 126 is controlled by the controller 180.

The processing chamber 100 has a port 117 fluidly connected to a fluid circuit 190. The fluid circuit 190 includes one or more heaters configured to maintain the temperature of the fluid circuit 190 at a temperature above the condensation point of the processing fluid flowing through the fluid circuit 190. The fluid circuit 190 is connected to a gas panel 150 configured to provide a processing fluid to the internal volume 115. The processing fluid may comprise a gas, such as a carbon-containing gas, for example carbon dioxide ($CO_2$) gas. The fluid circuit 190 is also connected to a pump 176 configured to remove the processing fluid from the internal volume 115.

During processing of the substrate 112, such as a high-pressure annealing of the substrate 112, the internal volume 115 is maintained at pressure greater than 1 bar, for example greater than about 2 bars, for example from about 2 bars to about 50 bars. The internal volume 115 is filled with the processing fluid during processing. In other words, the substrate 112 is annealed in an ambient environment including the processing fluid and at a pressure greater than 1 bar. The temperature of the internal volume 115 and/or the substrate 112 may be maintained from about 200 degrees Celsius to about 500 degrees Celsius during processing.

Figure 2:
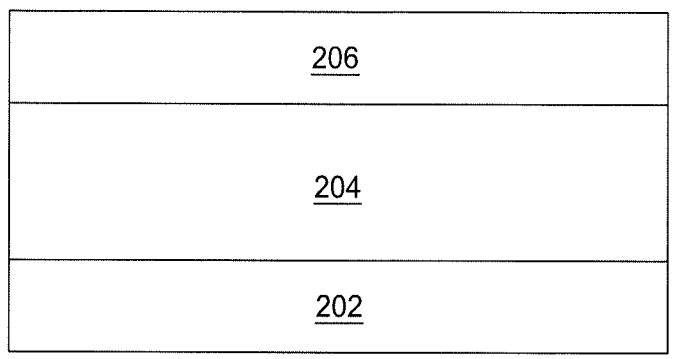
FIG. 2 is a schematic cross-sectional view of a structure including a transition metal oxide layer according to one embodiment described herein.

FIG. 2 is a schematic cross-sectional view of a structure 200 including a doped transition metal oxide layer 204 according to one embodiment described herein. The structure 200 may be a part of a cell of a RAM, such as ReRAM or CeRAM. The structure 200 includes a first one or more layers 202, a second one or more layers 206, and the doped transition metal oxide layer 204 disposed between the first one or more layers 202 and the second one or more layers 206. The first one or more layers 202 include at least an electrode, such as a metal electrode, for example, an iridium or platinum electrode. In one embodiment, the one or more layers 202 include an electrode that is fabricated from polysilicon or doped semiconductor. In one embodiment, the one or more layers 202 include a metal electrode and a doped semiconductor layer. The second one or more layers 206 may be fabricated from the same material as the first one or more layers 202.

The doped transition metal oxide layer 204 is fabricated from an oxide of a transition metal, such as nickel, copper, titanium, iron, cobalt, zinc, or yttrium, doped with a dopant. In one embodiment, the transition metal is nickel, the dopant is carbon, and the doped transition oxide layer 204 is a carbon-doped NiO layer.

Conventionally, the carbon-doped NiO layer is formed by CVD at a temperature of about 350 degrees Celsius. However, the carbon-doped NiO layer is thermodynamically unstable above the deposition temperature of about 350 degrees Celsius. Downstream processing steps for device fabrication can be at temperatures up to 400 degrees Celsius, resulting in outgassing of carbon dopant that drives an autocatalytic reduction of NiO. Thus, in one or more embodiments of the present disclosure, a high-pressure annealing process is performed on the carbon-doped NiO layer in order to treat the carbon-doped NiO layer so outgassing of carbon dopant is prevented during downstream process steps at temperatures higher than the deposition temperature of the carbon-doped NiO layer.

Figure 3:
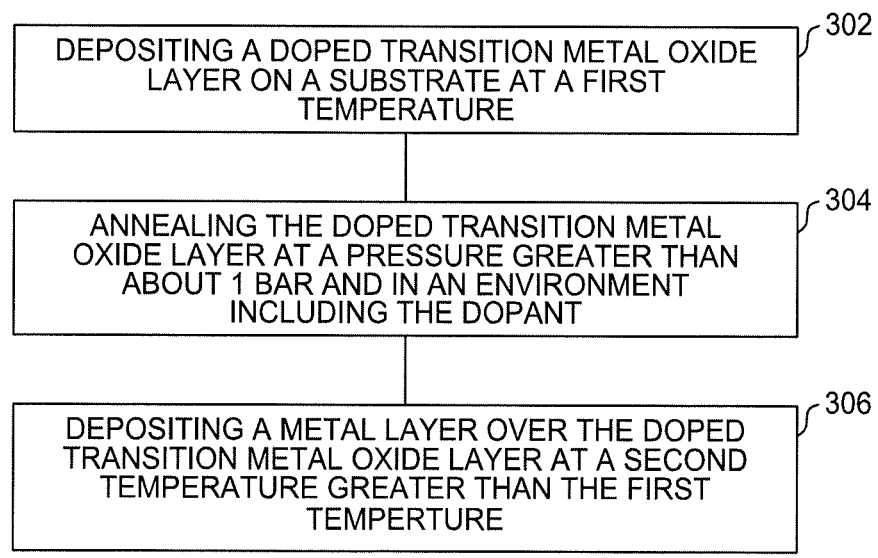
FIG. 3 is a flow chart illustrating a method for forming the transition metal oxide layer according to one embodiment described herein.

FIG. 3 is a flow chart illustrating a method 300 for forming a doped transition metal oxide layer according to one embodiment described herein. The method 300 starts with block 302, at which a doped transition metal oxide layer, such as the doped transition metal layer 204, is deposited on a substrate at a first temperature. The substrate may be any suitable substrate, such as a silicon substrate. The substrate may include one or more layers or structures formed thereon, and the doped transition metal oxide layer may be deposited on a layer or structure formed on the substrate. In one embodiment, the doped transition metal oxide layer is deposited on an electrode, such as a metal electrode or polysilicon electrode.

The doped transition metal oxide layer may be deposited by CVD. Organometallic precursors may be used to deposit the doped transition metal oxide layer. In one embodiment, the organometallic precursors include the transition metal, oxygen, and dopant (e.g., carbon), so the transition metal oxide layer as deposited is doped with the dopant. In another embodiment, the transition metal oxide layer is first deposited by any suitable method, such as CVD or physical vapor deposition (PVD), and the dopant is incorporated into the transition metal oxide layer by a separate doping process. In one embodiment, an implanting process is performed on the transition metal oxide layer to incorporate the dopant into the transition metal oxide layer. In one embodiment, the first temperature is about 350 degrees Celsius. In one embodiment, the dopant is carbon.

Next, at block 304, the doped transition metal oxide layer is annealed at a pressure greater than about 1 bar and in an ambient environment including the dopant. The high-pressure annealing process may be performed in a processing chamber, such as the processing chamber 100 shown in FIG. 1. The pressure of the processing chamber is greater than about 1 bar during the high-pressure annealing process. In one embodiment, the pressure of the processing chamber ranges from about 2 bars to about 50 bars, such as from about 10 bars to about 45 bars. The high-pressure annealing process may be performed at a temperature ranging from about 200 degrees Celsius to about 500 degrees Celsius. In one embodiment, the temperature of the high-pressure annealing process is greater than the first temperature. In order to prevent the dopant from leaving the transition metal oxide layer during the high-pressure annealing process or subsequent processes, the ambient environment in which the high-pressure annealing pressure is performed includes the dopant. For example, the doped transition metal oxide layer is the carbon-doped NiO layer, and the high-pressure annealing process is performed in a carbon-containing ambient environment. In one embodiment, the ambient environment includes a carbon-containing gas, such as $CO_2$ gas.

It has been found that when annealing the doped transition metal oxide layer in an ambient environment including the dopant at a pressure greater than about 1 bar and a temperature greater than the deposition temperature of the doped transition metal oxide layer, there is no dopant reduction in the doped transition metal oxide layer. Furthermore, the dopant is driven deeper into the doped transition metal oxide layer. In addition, the bonding of transition metal and oxygen molecules is maintained. In contrast, annealing the doped transition metal oxide layer in an ambient environment that does not include the dopant at a pressure greater than about 1 bar and a temperature greater than the deposition temperature of the doped transition metal oxide layer, outgassing of the dopant occurs and the bonding of transition metal and oxygen molecules is significantly affected compared to the as-deposited doped transition metal oxide layer.

Next, at block 306, a metal layer is deposited over the doped transition metal oxide layer at a second temperature. The metal layer may be an aluminum contact layer. The second temperature is greater than the first temperature. In one embodiment, the second temperature is about 400 degrees Celsius. Because the doped transition metal oxide layer was annealed in an ambient environment including the dopant at a pressure greater than about 1 bar, there is no outgassing of the dopant during the deposition of the electrode at the second temperature greater than the first temperature. In one embodiment, the metal layer is deposited directly on an electrode, such as the metal or polysilicon electrode, that is deposited on the doped transition metal oxide layer. In another embodiment, one or more layers are deposited on the doped transition metal oxide layer, the electrode is deposited on the one or more layers, and the metal layer is deposited on the electrode. The one or more layers may include at least one conductive transition metal oxide layer.

By annealing a doped transition metal oxide layer in an ambient environment including the dopant at a pressure greater than about 1 bar, dopant outgassing from the doped transition metal oxide layer is minimized. Furthermore, the dopant is driven deeper into the doped transition metal oxide layer, and the bonding of transition metal and oxygen molecules is maintained.

While the foregoing is directed to embodiments of the present disclosure, other and further embodiments of the disclosure may be devised without departing from the basic scope thereof.

What is claimed is:

1. A method, comprising:
   depositing a doped transition metal oxide layer on a substrate at a first temperature, the doped transition metal oxide layer comprising a dopant; and
   annealing the doped transition metal oxide layer in a processing chamber at a chamber pressure greater than about 1 bar and in an ambient environment comprising the dopant.

2. The method of claim 1, wherein the doped transition metal oxide layer is a carbon-doped nickel (II) oxide layer.

3. The method of claim 1, wherein the doped transition metal oxide layer is annealed at a temperature ranging from about 200 degrees Celsius to about 500 degrees Celsius.

4. The method of claim 1, wherein the chamber pressure ranges from about 2 bars to about 50 bars.

5. The method of claim 4, wherein the chamber pressure ranges from about 10 bars to about 45 bars.

6. The method of claim 1, wherein the annealing is performed at a second temperature greater than the first temperature.

7. The method of claim 6, wherein the first temperature is about 350 degrees Celsius.

8. A method, comprising:
   depositing a doped transition metal oxide layer on a first electrode, the doped transition metal oxide layer comprising a dopant;
   annealing the doped transition metal oxide layer in a processing chamber at a chamber pressure greater than about 1 bar and in an ambient environment comprising the dopant; and
   depositing a metal layer over the doped transition metal oxide layer.

9. The method of claim 8, wherein the dopant is carbon.

10. The method of claim 9, wherein the ambient environment comprises $CO_2$ gas.

11. The method of claim 10, wherein the doped transition metal oxide layer comprises carbon-doped nickel (II) oxide layer.

12. The method of claim 8, further comprising depositing a second electrode on the doped transition metal oxide layer, wherein the first electrode and the second electrode each comprise a metal that is different from the metal layer, and wherein the metal layer is deposited on the second electrode.

13. The method of claim 12, wherein the metal layer comprises aluminum and the metal is iridium or platinum.

14. The method of claim 8, wherein the chamber pressure ranges from about 2 bars to about 50 bars.

15. The method of claim 14, wherein the chamber pressure ranges from about 10 bars to about 45 bars.

16. The method of claim 1, wherein the annealing is performed at a temperature ranging from about 200 degrees Celsius to about 500 degrees Celsius.

17. A method, comprising:
   depositing a carbon-doped nickel (II) oxide layer on a substrate at a first temperature;
   annealing the carbon-doped nickel (II) oxide layer in a processing chamber at a chamber pressure greater than about 1 bar and in a carbon-containing ambient environment; and
   depositing a metal layer over the carbon-doped nickel (II) oxide layer at a second temperature greater than the first temperature.

18. The method of claim 17, wherein the chamber pressure ranges from about 2 bars to about 50 bars.

19. The method of claim 17, wherein the first temperature is about 350 degrees Celsius and the second temperature is about 400 degrees Celsius.

20. The method of claim 17, wherein the annealing is performed at a temperature ranging from about 200 degrees Celsius to about 500 degrees Celsius.

* * * * *